United States Patent
Wollesen

[19]

[11] Patent Number: 5,856,708
[45] Date of Patent: *Jan. 5, 1999

[54] POLYCIDE/POLY DIODE SRAM LOAD

[75] Inventor: Donald L. Wollesen, Saratoga, Calif.

[73] Assignee: Advanced Micro Devices, Inc., Sunnyvale, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 735,831

[22] Filed: Oct. 23, 1996

[51] Int. Cl.⁶ ............................. H01L 27/11; H01L 29/00; G11C 11/36

[52] U.S. Cl. ................... 257/904; 256/536; 256/538; 256/903; 365/175

[58] Field of Search ..................................... 257/536, 538, 257/903, 904, 910; 365/148, 175

[56] References Cited

U.S. PATENT DOCUMENTS

| | | | |
|---|---|---|---|
| 5,021,849 | 6/1991 | Pfiester et al. | 257/365 |
| 5,135,888 | 8/1992 | Chan et al. | 437/186 |
| 5,198,382 | 3/1993 | Campbell et al. | 257/538 |
| 5,313,087 | 5/1994 | Chan et al. | 257/538 |
| 5,396,454 | 3/1995 | Nowak | 365/154 |
| 5,616,946 | 4/1997 | Hsu et al. | 257/390 |

Primary Examiner—Mahshid D. Saadat
Assistant Examiner—Allan R. Wilson
Attorney, Agent, or Firm—H. Donald Nelson

[57] ABSTRACT

A method of manufacturing an SRAM cell with polysilicon diode loads using standard logic technology processing. A P+ polysilicon area and an N+ polysilicon are forms a lateral PN junction. In standard logic technology processing the lateral PN junction is shorted out. In the present invention the lateral PN junction is allowed to function as a polysilicon diode load and an ancilliary lateral PN junction is shorted using a polycide cap layer.

3 Claims, 3 Drawing Sheets

POLYCIDE/POLY DIODE SRAM LOAD

BACKGROUND OF THE INVENTION

1. Field of the Invention

This invention relates generally to the manufacture of high performance semiconductor devices and, more particularly, to the manufacture of high performance small area SRAM cells and, even more particularly, to the manufacture of high performance small area SRAM cells having polysilicon diode loads.

2. Discussion of the Related Art

Static random access memory (SRAM) is used in computers as memory that is used by the microprocessor or central processing unit to store instructions and data from programs that are currently being used by the computer. The SRAM memory often used in this way is generally known as cache and is located between the microprocessor and the memory known as main memory. To attain the maximum benefits that SRAM can provide, the SRAM cache memory is ideally manufactured on the microprocessor chip which makes the SRAM cell area critical. Main memory is typically dynamic random access memory (DRAM). The SRAM cells used in the cache memory is optimized to run at the speed of the microprocessor. The reason that SRAM is not normally used for main memory is that because SRAM is optimized to run at the speed of the microprocessor it is more costly than DRAM and takes more chip space. This is because, in order to make the RAM run at the speed of the microprocessor it is necessary to use more transistors, typically four to six transistors per bit, to allow high-speed direct access to information in the memory by the microprocessor. DRAM memory typically uses 1 transistor per bit. This means that less memory is available per unit area on an SRAM chip and results in higher cost. Because of the increasing requirements of modern memory-hungry applications which are reaching multiple-megabyte proportions, DRAM will remain the memory of choice for main memory. However, modern computer systems require more cache memory to allow the microprocessor to fetch and process information at full speed. As the speed of the microprocessors increases and as more use of multitasking increases, the requirements for more higher speed SRAM memory will continue to grow. In addition, to achieve the full speed direct access, it is also becoming necessary for the computer designer to continue to design the cache memory to be manufactured on the main CPU chip.

For this reason, the size of the SRAM memory cell is very important. Numerous methods and devices have been conceived and tried in order to shrink the size of the individual SRAM memory cell. The comparison standard remains the classic CMOS (complementary metal on silicon) six transistor design consisting of a CMOS R-S flip-flop and two transmission gates to allow for the necessary read and write functions. The standard load devices in the R-S flip-flop in the six transistor SRAM memory cell are p-channel transistors. However, the p-channel transistors are not critical and can be replaced with passive loads such as "poly load," diode loads (reverse biased, leakage current only), and depletion NMOS loads. Plain low resistance material works, but draws too much current for practical large RAM (random access memory) arrays. Prior art poly loads and diode loads entail thin film deposition masking, doping, and some physical area in the cell.

What is needed is a smaller SRAM cell that can be manufactured using standard logic process technology. A standard logic process technology is defined as a process technoloy having N+ and P+ polysilicon gates with a refractory metal on top of the N+ and P+ lateral junctions to "short out" these lateral junctions.

SUMMARY OF THE INVENTION

The present invention is directed to a method of manufacturing a polysilicon diode load for SRAM cells using a standard process in which an N+ region connected to $V_{cc}$ is formed, a P+ region connected to the NMOS gate electrode of an R-S flip-flop is formed and the N+ and P+ regions form a lateral PN junction.

The PN junction is masked to prevent polycide formation over the junction.

The present invention is better understood upon consideration of the detailed description below, in conjunction with the accompanying drawings. As will become readily apparent to those skilled in this art from the following description there is shown and described a preferred embodiment of this invention simply by way of illustration of the mode best suited to carry out the invention. As it will be realized, the invention is capable of other different embodiments, and its several details are capable of modifications in various, obvious aspects all without departing from the scope of the invention. Accordingly, the drawings and descriptions will be regarded as illustrative in nature and not as restrictive.

BRIEF DESCRIPTION OF THE DRAWINGS

The accompanying drawings incorporated in and forming a part of the specification, illustrate the present invention, and together with the description serve to explain the principles of the invention. In the drawings.

DETAILED DESCRIPTION

Figure 1A:
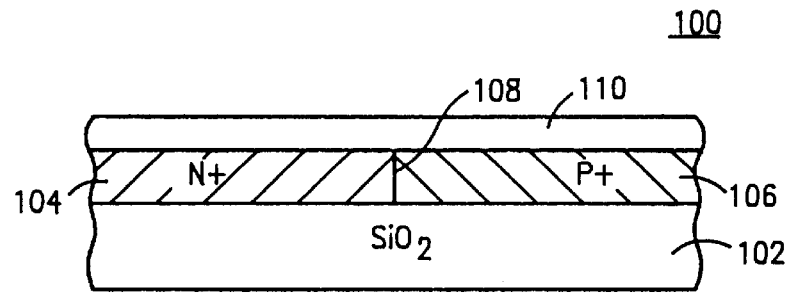
FIG. 1A is side view of a prior art device with the N+ and P+ lateral junction shorted by an overlayer of a polycide.
Figure 1B:
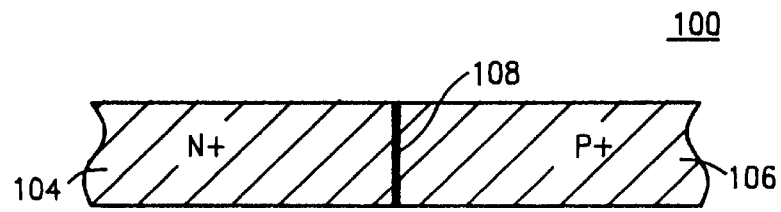
FIG. 1B is a top view of the prior art device shown in FIG. 1A.

Referring to FIGS. 1A and 1B there is shown a portion of a prior art device 100 which is manufactured using "standard" logic technology processing. FIG. 1A is a side view of the portion of the device 100 showing a layer of silicon dioxide 102 with an area of N+ polysilicon 104 and an area of P+ polysilicon 106. Between the area of N+ polysilicon 104 and the area of P+ polyxilicon 106 a lateral PN junction, indicated at 108 is formed. FIG. 1A illustrates the standard logic technology processing which forms a layer of a refractory metal 110 which, in turn, forms a polycide on the top of the area of N+ polysilicon 104 and the area of P+ polysilicon 106. This layer of polycide, referred to as a cap layer 110, which is formed by the combination of the refractory metal, such as tungsten, with silicon during an annealing process. The cap layer of polycide serves to short out the lateral PN junction 108 which prevents the PN junction from acting as a diode.

Figure 2A:
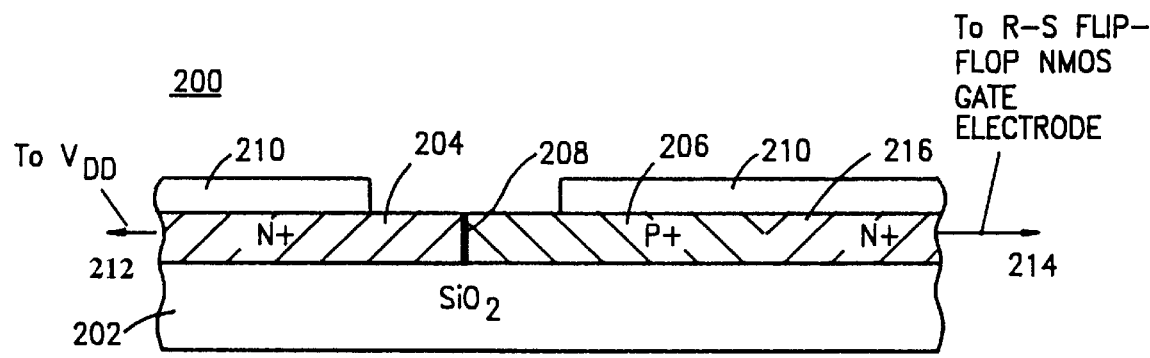
FIG. 2A is a side view of a device with the N+ and P+ lateral junction formed as a polysilicon diode load.
Figure 2B:
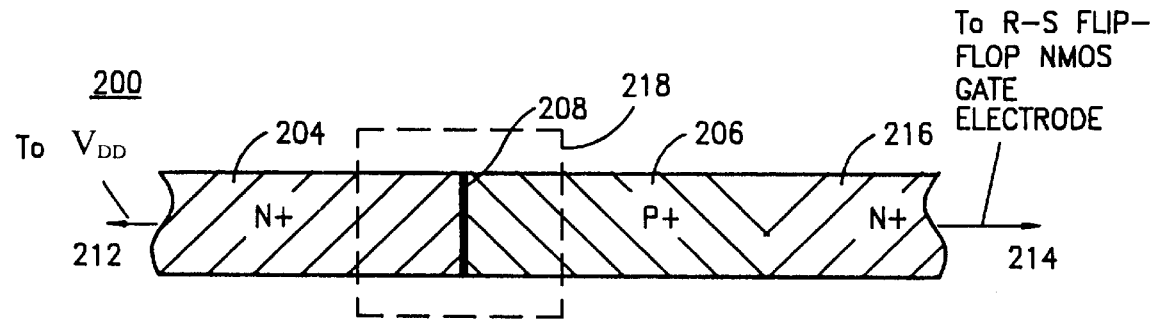
FIG. 2B is a top view of the device shown in FIG. 2A.

Referring to FIGS. 2A and 2B there is shown a portion of a device 200 of the present invention which is manufactured by modifying the standard logic technology processing. FIG. 2A is a side view of the portion of the device 200 showing a layer of silicon dioxide 202 with an area of N+ polysilicon 204 and an area of P+ polysilicon 206. Between the area of N+ polysilicon 204 and the area of P+ polysilicon 206 a lateral PN junction 208 is formed. The area of N+ polysilicon is connected to $V_{DD}$ (not shown) as indicated at 212. The area of P+ polysilicon is connected to the R-S flip-flop NMOS gate electrode (not shown) as indicted at 214. The area of P+ polysilicon 206 is shown converting to an area of N+ polysilicon, indicated at 216, before it reaches the R-S flip-flop NMOS gate electrode. FIG. 2A & 2B illustrate the modification of the standard process logic technology as used in the prior art. The layer of polycide 210 does not extend over the lateral PN junction 208. A following process step would deposit or form a non-conducting layer over the junction thus allowing the junction to act as a diode. FIG. 2B indicates a masking step, shown by dashed line 218 which either prevents the formation of the polycide layer 210 over the PN junction or removes the refractory metal before a later annealing process step is done. One such process is the use of a "resistor mask" which exposes the lateral PN junction 208 and prevents polycide formation. A resistor mask removes any deposited refractory metal such as tungsten. As discussed above, by not shorting out the PN junctions allows them to act as polysilicon diodes. The polysilicon diodes then act as SRAM load elements. The leakage of a polysilicon diode is somewhat higher than monocrystalline junction leakage. This is desirable in the case of the polysilicon diodes for SRAM cell loads because the load "leakage" must be greater than transistor leakage in order for the polysilicon diode loads to operate correctly. Since the polysilicon diodes used as an SRAM load are reverse biased, the load current is also a reverse diode leakage current. The temperature coefficient therefore will track the transistor drain junction leakage, but will always remain higher because the polysilicon diode is formed from inferior crystalline materials.

Figure 3:
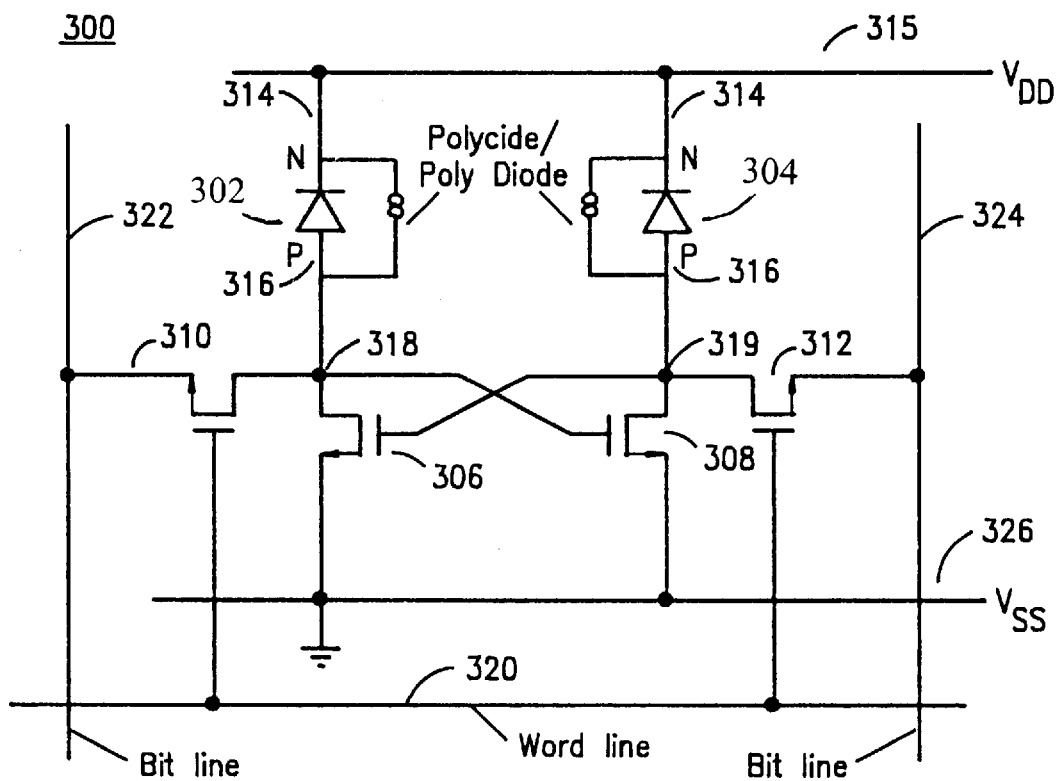
FIG. 3 is a schematic circuit diagram of a four transistor SRAM cell with a polysilicon diode load.

Referring to FIG. 3 there is shown a schematic circuit diagram of a four transistor SRAM cell 300 with polysilicon diode loss loads, 302 and 304. As will be appreciated by one of ordinary skill in the art, the SRAM cell 300 is constructed of four transistors rather than the more "standard" six transistor construction. The SRAM cell 300 is made up of the two flip-flop NMOS transistors 306 and 308 and the two pass gate transistors 310 and 312 which are used to access the data cell during read and write operations. The prior art SRAM cell was typically either an NMOS version or CMOS version. In either the NMOS version or the CMOS version, the transistors 306 and 308 are n-channel MOSFETs and are typically cross-connected to two other transistors to form an inverter. In the NMOS version the two load transistors are commonly n-channel depletion mode transistors or high resistance polysilicon resistors and in the CMOS version the two load transistors are p-channel MOSFETs. The NMOS cell can be implemented in a CMOS technology. The N+ polysilicon areas, indicated at 314, are connected to the $V_{DD}$ supply line 315. The P+ polysilicon areas, indicated at 316, are connected to the common junctions, indicated at 318 and 319. The source electrode of the pass gate transistor 310, and the drain electrode of the flip-flop transistor 306 form common junction 318. The gate electrode of the flip-flop transistor 308 is connected to the common junction 318 associated with the polysilicon diode 302. The source electrode of the pass gate transistor 312, and the source electrode of the flip-flop transistor 308 form common junction 319. The gate electrode of the flip-flop transistor 306 is connected to the common junction 319 associated with the polysilicon diode 304. The gates of the the pass gate transistors 310 and 312 are connected to the word line 320. The drain electrodes of the pass gate transistors 310 and 312 are connected to the bit lines 322 and 324, respectively. The source electrodes of the flip-flop transistors 306 and 308 are connected to the $V_{SS}$ line 326. As will be appreciated by a person of ordinary skill in the art, the polysilicon diode loads 314 are shown in locations that the two other transistors would be formed in a prior art CMOS SRAM cell.

The off current of the pass gate transistors 310 and 312 and the flip-flop transistors 306 and 308 is well under 1 picoamp at room temperature. Due to the non-monocrystalline silicon, the thin film polysilicon diodes will have a leakage current greater than ten times that for small cross-section monocrystalline diodes of the common drain junctions 318 or 319. This level of leakage current is ideal for SRAM loads since the SRAM load leakage must be small yet much greater than the transistor leakage current. Threshold voltages of the SRAM transistors need to be high enough to prevent sub-threshold current from being nearly as much as the polysilicon diode load current.

Figure 4:
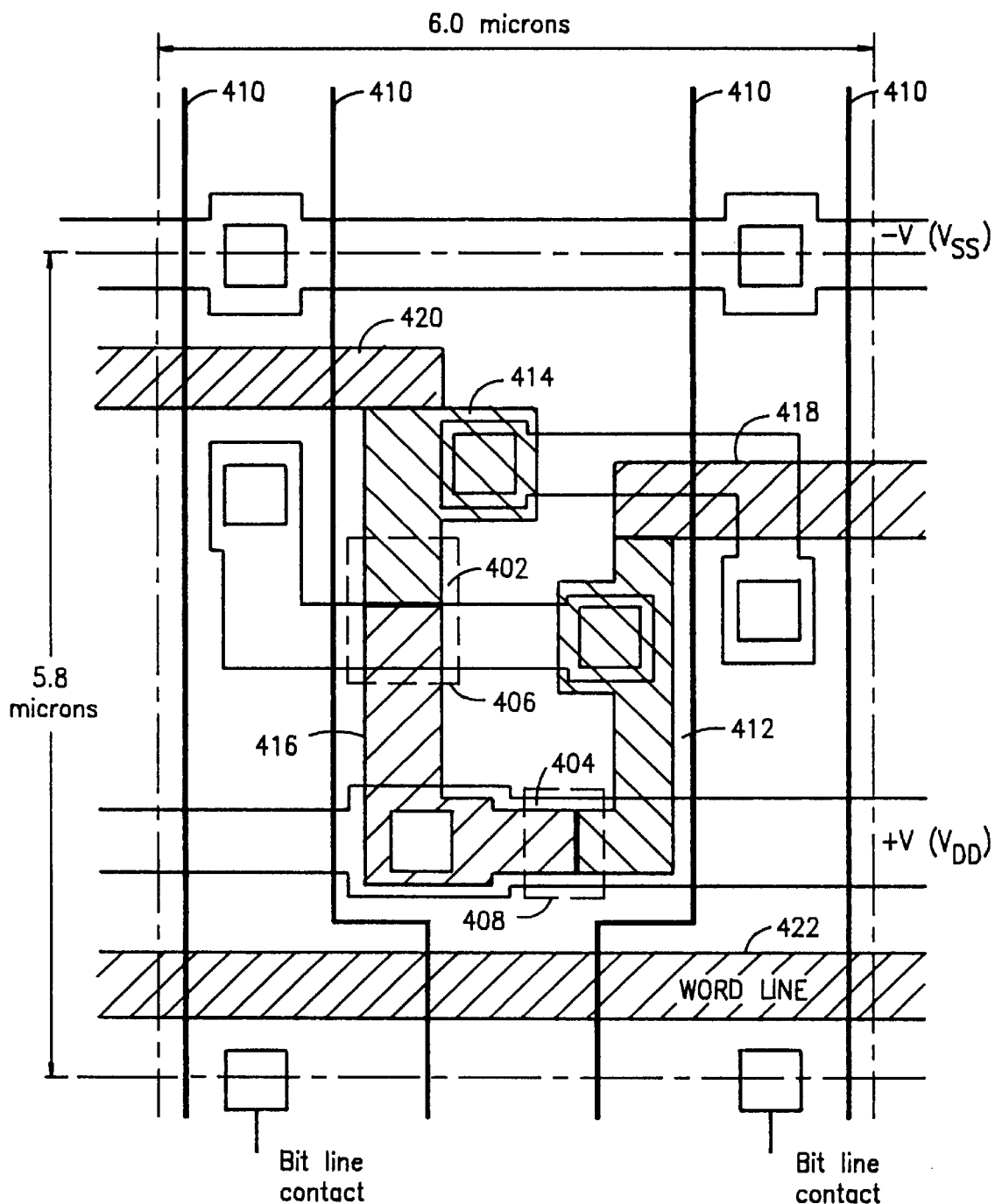
FIG. 4 shows the SRAM cell layout.

Referring to FIG. 4 there is shown an exemplary layout of the SRAM cell 400 with polysilicon diode loads indicated at 402 and 404. The example uses 0.4 micron feature sizes. The positions of the resistor protect masks are indicated by dashed lines 406 and 408. The lines 410 represent the source/drain boundaries. The P+ polysilicon cell interconnect material is indicated by left-leaning cross-hatching at 412 and 414. The N+ polysilicon interconnect material is indicated by right-leaning cross-hatching at 416, 418, 420, and 422. One of the advantages of the present invention is that the SRAM cell can be made smaller. The SRAM cell 400 is 6.0 microns wide and 5.8 microns high resulting in an area of 34.8 square microns. Another advantage of the present invention is that the cell requires no extra processing in a standard 0.5 micron or less CMOS logic process presently used in the semiconductor industry. The SRAM cell is substantially smaller than a comparable six transistor cell using the same design rules which use PMOS transistor loads.

The foregoing description of the preferred embodiment of the invention has been presented for purposes of illustration and description. It is not intended to be exhaustive or to limit the invention to the precise form disclosed. Obvious modifications or variations are possible in light of the above teachings. The embodiment was chosen and described to provide the best illustration of the principles of the invention and its practical application to thereby enable one of ordinary skill in the art to utilize the invention in various embodiments and with various modifications which are suited to the particular use contemplated. All such modifications and variations are within the scope of the invention as determined by the appended claims when interpreted in accordance with the breadth to which they are fairly, legally, and equitably entitled.

What I claim is:

1. A semiconductor integrated circuit element having a single diode load element, comprising:
   an area of p+ polysilicon with an overlying polycide capping layer formed on a surface of the p+ polysilicon;
   an area of n+ polysilicon with an overlying polycide capping layer formed on a surface of the n+ polycide;
   a first end of the n+ polysilicon area and the overlying polycide capping layer connected to a first circuit element;
   a first end of the p+ polysilicon area and the overlying polycide capping layer connected to a gate electrode, wherein the single diode load element is formed in the gate electrode layer; and a second end of the n+ polysilicon area with a portion of the overlying polycide capping layer removed connected to a second end of the p+ polysilicon area with a portion of the overlying polycide capping layer removed, forming a p/n junction between the p+ polysilicon area and the n+ polysilicon area, wherein there is no polycide capping layer overlying the p/n junction.

2. The semiconductor integrated circuit element of claim 1 wherein the p+ polysilicon area converts to an n+ polysilicon area and the resulting p/n junction is electrically shorted by the overlying polycide capping layer.

3. The semiconductor integrated circuit element of claim 2 wherein the first circuit element is $V_{DD}$.

* * * * *